(12) United States Patent
Ozawa

(10) Patent No.: US 6,264,479 B1
(45) Date of Patent: Jul. 24, 2001

(54) SOCKET FOR HANDLER

(75) Inventor: Kazuhisa Ozawa, Kawaguchi (JP)

(73) Assignee: Enplas Corporation, Saitama-ken (JP)

( * ) Notice: Subject to any disclaimer, the term of this patent is extended or adjusted under 35 U.S.C. 154(b) by 0 days.

(21) Appl. No.: 09/424,199
(22) PCT Filed: Sep. 1, 1999
(86) PCT No.: PCT/JP99/04745
  § 371 Date: Nov. 18, 1999
  § 102(e) Date: Nov. 18, 1999
(87) PCT Pub. No.: WO00/14833
  PCT Pub. Date: Mar. 16, 2000
(51) Int. Cl.⁷ .................................................. H01R 12/00
(52) U.S. Cl. ............................ 439/70; 439/71; 439/525; 439/862
(58) Field of Search ........................... 439/70, 71, 72, 439/73, 525, 526, 862

(56) References Cited

U.S. PATENT DOCUMENTS 4,470,650 * 9/1984 Lundergan ........................ 439/70
4,542,949 * 9/1985 Tewes et al. ...................... 439/70
5,376,010 * 12/1994 Petersen ........................... 439/71
5,451,165 * 9/1995 Cearley-Cabbiness et al. ..... 439/71

* cited by examiner

Primary Examiner—Paula Bradley
Assistant Examiner—Tho D. Ta
(74) Attorney, Agent, or Firm—Fish & Richardson P.C.

(57) ABSTRACT

A handler socket has confronting surfaces to which an electrical part and a circuit substrate are connected for an electrical conduction between the electrical part and the circuit substrate. The handler socket comprises a socket body; a plurality of contact pins contacting with the electrical part and the circuit substrate so as to electrically connect the electrical part with the circuit substrate; and a holder holding the plurality of contact pins and adapted to be engaged with the socket body. Each of the contact pins has a contact portion and is held to the holder, whereby the contact portion projects from the confronting surfaces and the holder is removably mounted on a side of the socket body.

8 Claims, 7 Drawing Sheets

SOCKET FOR HANDLER

TECHNICAL FIELD

The present invention relates to a handler socket intervening between an electrical part such as a semiconductor device (hereinafter referred to as an IC package) and a circuit substrate for connecting the electrical part with the circuit substrate.

BACKGROUND ART

In a conventional "handler", as described in Japanese Unexamined Patent Publication No. 10-113580, a large number of IC carriers each accommodating the IC package are mounted on a test tray so that the test tray is conveyed with the IC carriers.

Although not described in the above mentioned publication, a large number of handler sockets are arranged in predetermined positions on the circuit substrate associated with an IC tester.

After positioning of the IC carriers conveyed by the test tray to the handler sockets, respectively, the IC packages accommodated in the IC carriers are pressed downward by a contact pressure element so that terminals of the IC packages are pressed against the handler sockets so that the IC packages are electrically conducted to the circuit substrate through the corresponding handler sockets.

Each of the handler sockets comprises a socket body and a large number of contact pins disposed thereto. Each of the contact pins is adapted to contact with each of the terminals of the IC package and the circuit substrate, thereby electrically connecting the IC package and the circuit substrate.

With the electrical connection between the circuit substrate of the IC tester and each IC package, a test of each IC package is carried out by the IC tester and, on the basis of the tested result, each IC package is sorted into non-defective and defective ones.

In such a conventional handler, however, the handler sockets must be positioned to both of the IC carriers and the circuit substrate, respectively. In addition, it is necessary to determine a number of the contact pins and pitches therebetween to correspond to the terminals of the IC package.

Therefore, in a case where the positioning portions of the IC carriers or those of the circuit substrate change, or where the number of terminals of the IC package and the pitches therebetween change, to replace all of the handler sockets must be required, resulting in higher costs of the handler.

It is therefore the object of the present invention, even in the case where the positioning portions of the IC carriers or those of the circuit substrate change, or where the number of terminals of the IC package and the pitches therebetween change, to provide a handler socket capable of achieving a partial sharing or common use of its elements.

DISCLOSURE OF THE INVENTION

In order to achieve such object, according to one aspect of the present invention, there is provided a handler socket having confronting surfaces adapted to be connected to an electrical part and a circuit substrate for an electrical conduction between the electrical part and the circuit substrate, the handler socket comprising a socket body; a plurality of contact pins contacting with the electrical part and the circuit substrate so as to electrically connect the electrical part with the circuit substrate; and a holder holding the plurality of contact pins and adapted to be engaged with the socket body; each of the contact pins having a contact portion and being held to the holder so that the contact portion projects from the confronting surfaces, the holder being removably mounted on a side of the socket body.

In the handler socket according to one aspect of the present invention, since the holder holding the plurality of contact pins is removably mounted on the side of the socket body, in a case where an IC carrier or the circuit substrate is replaced, or where electrical parts have different numbers of terminals with the same or different intervals therebetween, it is able to cope with the replacement or the difference of the numbers of terminals or the intervals by merely replacing one of the holder and the socket body, making it possible to consequently achieve the sharing or the common use of elements of the other thereof.

According to another aspect of the present invention, the holder holding a different number of the contact pins and/or different intervals therebetween is permitted to be mounted on the socket body.

According to further aspect of the present invention, the socket body is formed with positioning portions by which the electrical part or the circuit substrate is positioned, so that the socket body including the positioning portions which have different locations and different shapes is enabled to be mounted on the holder.

According to still further aspect of the present invention, each of the contact pins has a substantially U-shape, the contact portion being formed close to an end portion of each of the U-shaped contact pins.

In the still further aspect of the present invention, since each of the contact pins has a substantially U-shape and the contact portion is formed close to an end portion of each of the U-shaped contact pins, it is possible to reduce the thickness of the handler socket while simultaneously allowing the same contact pressure to be applied to the both end portions of each of the contact pins, thereby improving a stability of contact. Furthermore, each of the U-shaped contact pins makes short a flow path of a current, and therefore, it is possible to make the handler socket suitable for the testing of the IC packages by using a high frequency.

According to still further aspect of the present invention, the contact portion of each of the contact pins has a projection shape which projects outwardly of the U-shaped portion, and an amount of the projection of the contact portion of the electrical part side, to which the electrical part is connected, from the confronting surfaces is set to be larger than an amount of the projection of the contact portion of the circuit substrate side, to which the circuit substrate is connected, therefrom.

In the still further aspect of the present invention, since the contact portion of each of the contact pins has a projection shape which projects outwardly of the U-shaped portion so that an amount of the projection of the contact portion of the electrical part side, to which the electrical part is connected, from the confronting surfaces is set to be larger than an amount of the projection of the contact portion of the circuit substrate side, to which the circuit substrate is connected, therefrom, it is possible to suitably contact the contact portion of the electrical part side with a terminal of the electrical part.

According to the still further aspect of the present invention, while the holder is mounted on the socket body, wherein an end portion of each of the contact pins is engaged with a contact pin engagement portion of the socket body so that each of the contact pins is subjected to a pre-load.

In the still further aspect of the present invention, because, while the holder is mounted on the socket body, an end portion of each of the contact pins is engaged with a contact pin engagement portion of the socket body so that each of the contact pins is subjected to a pre-load, it is possible to improve an alignment of the contact pins and make each height of each contact portion uniform.

According to still further aspect of the present invention, the holder is provided with insulating walls interposed between the contact pins and adapted to insulate the contact pins, each of the insulating walls being adapted to be fitted into a fitting recess portion, the fitting recess portion being formed in the socket body.

In the still further aspect of the present invention, because the holder is provided with insulating walls interposed between the contact pins and adapted to insulate the contact pins so that each of the insulating walls is adapted to be fitted into a fitting recess portion formed in the socket body, it is possible to improve a workability of mounting the holder and a positional accuracy thereof, thus presenting a useful effect in practical use.

BEST MODE FOR CARRYING OUT THE INVENTION

Figure 1:
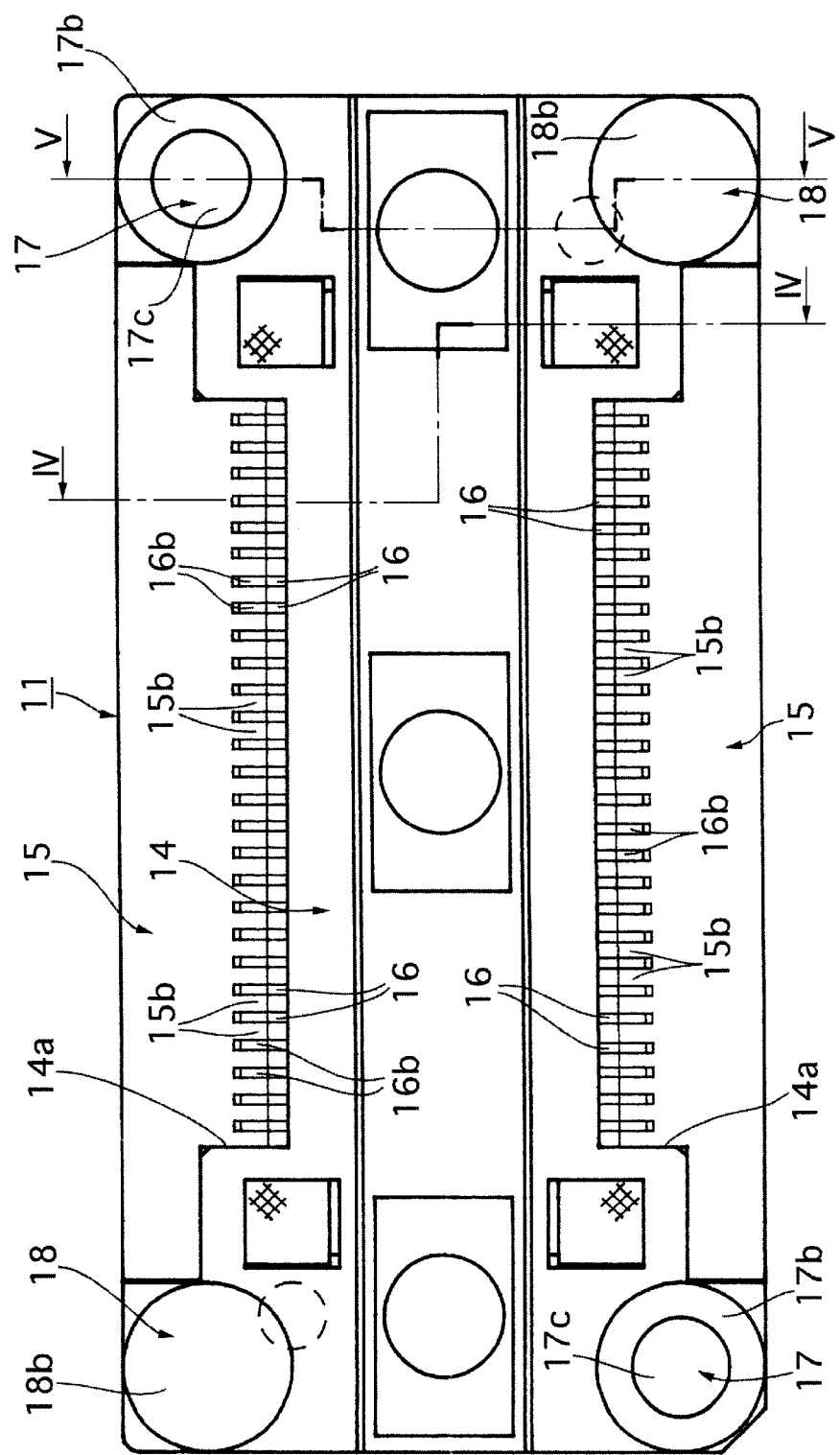
FIG. 1 is a top plan view of a handler socket in accordance with an embodiment of the present invention.
Figure 2:
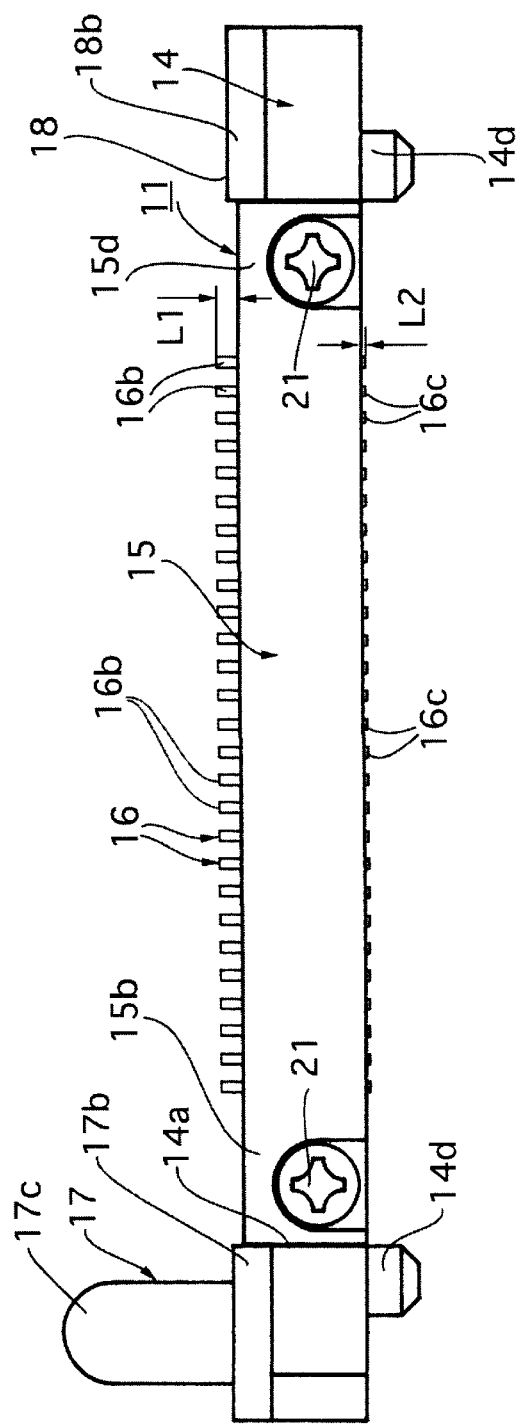
FIG. 2 is a front elevational view of the handler socket according to the embodiment.
Figure 3:
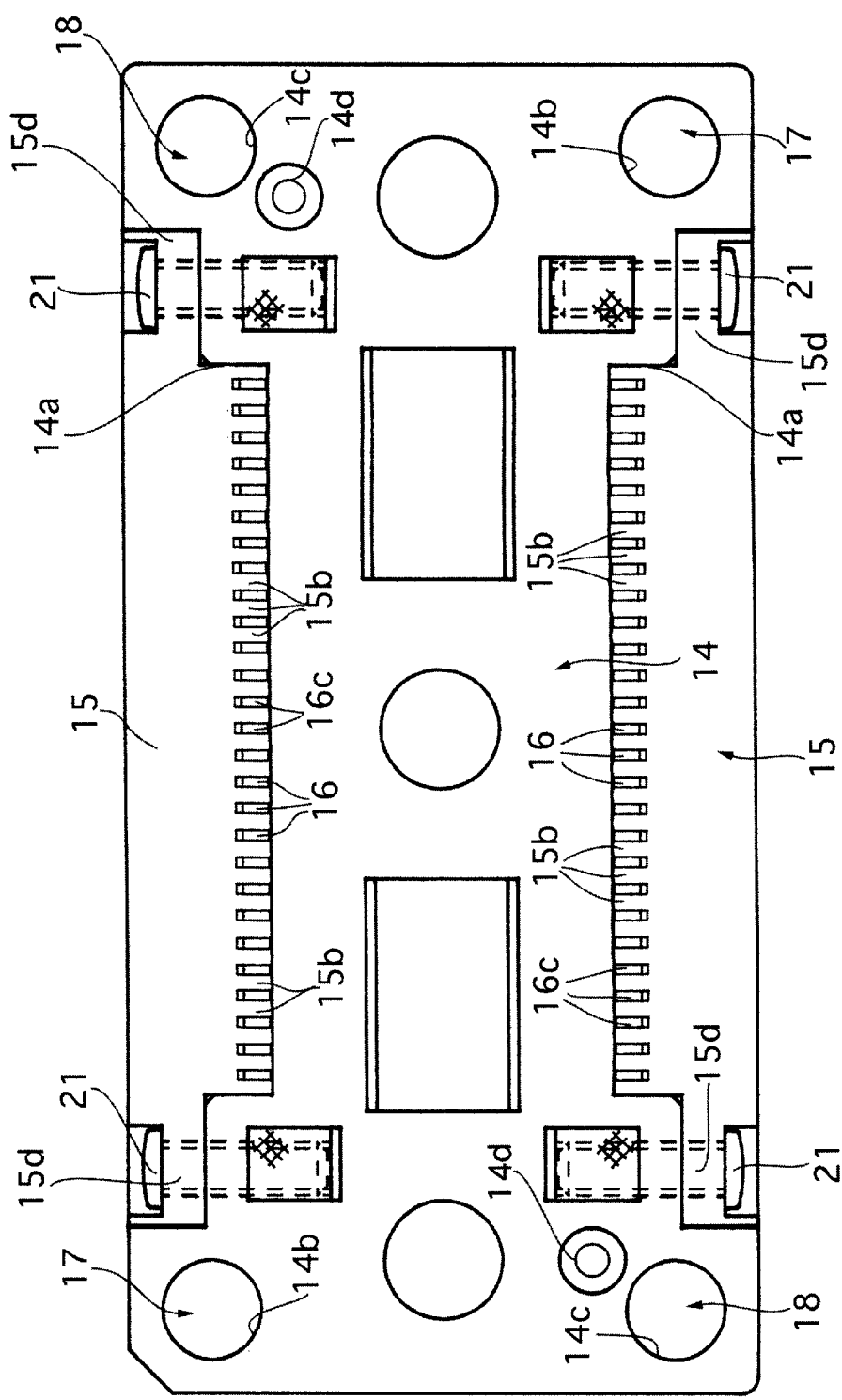
FIG. 3 is a bottom plan view of the handler socket in accordance with the embodiment.

The present invention will now be described hereinafter.

Referring to FIGS. 1 to 9, a first embodiment of the present invention is shown.

Description is first made of its structure. A numeral 11 in FIG. 1 designates a handler socket. In order to carry out a performance test of an IC package 12 as an "electrical part" shown in FIGS. 8 and 9, the handler socket 11 serves to provide an electrical connection between terminals 12b of the IC package 12 and a circuit substrate 13 associated with an IC tester.

The IC package 12 comprises a rectangular package body 12a and a large number of terminals 12b each projecting in the shape of a crank laterally from each side surface of the package body 12a and spaced along each side surface thereof at predetermined pitches. In this embodiment, the number of terminals 12b is 54 and the respective terminals 12b are arranged at intervals of 0.8 mm.

On the other hand, the handler IC socket 11 comprises a socket body 14 and a pair of holders 15. The holders 15 are removably disposed to the sides of the socket body 14 so that contact pins 16 corresponding in numbers and intervals to the terminals 12b are contained (held) in the holders 15.

Figure 5:
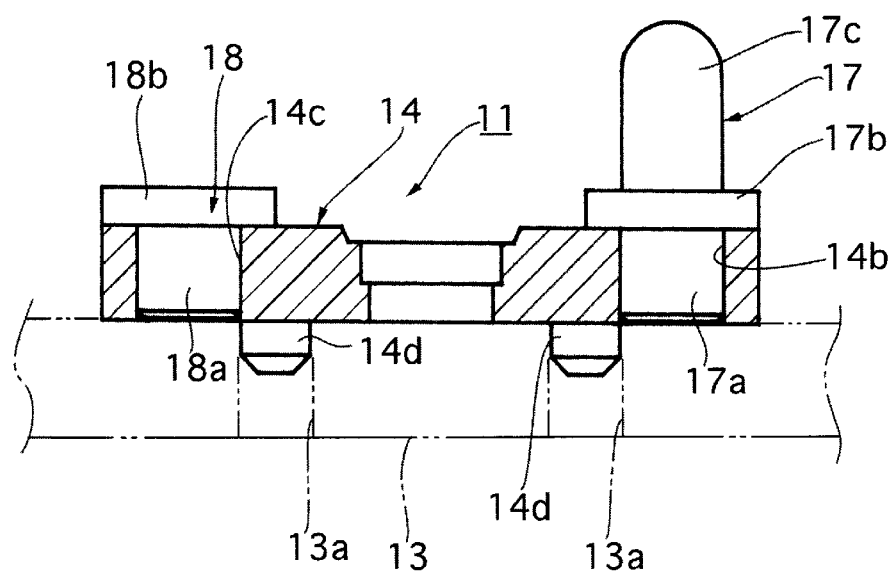
FIG. 5 is a sectional view taken along a line V—V of FIG. 1 in accordance with the embodiment.

Detailedly, the socket body 14 as shown in FIGS. 1, 5, etc. is in a form of a substantially rectangular plate and comprises a pair of notched portions 14a on which the pair of holders 15 is mounted. The socket body 14 is formed with positioning pin fitting holes 14b and stopper pin fitting holes 14c into which fitted positioning pins 17 and stopper pins 18 are fitted, respectively. The bottom surface of the socket body 14 is provided on its diagonal line with a pair of positioning projection portions 14d as "positioning portions" which are fitted into fitting holes of the circuit substrate 13 (See FIG. 3).

The positioning pin 17, as shown in FIG. 5, is made of a metal and comprises a fitting portion 17a which is fitted into the positioning pin fitting hole 14b, a collar portion 17b contacting with the top surface of the socket body 14, and a positioning portion 17c for positioning an IC carrier 20 which will be described later.

The stopper pin 18 as shown in FIG. 5 is provided with a fitting portion 18a fitted into the stopper pin fitting hole 14c, and a stopper portion 18b with which the IC carrier 20 contacts.

Figure 4:
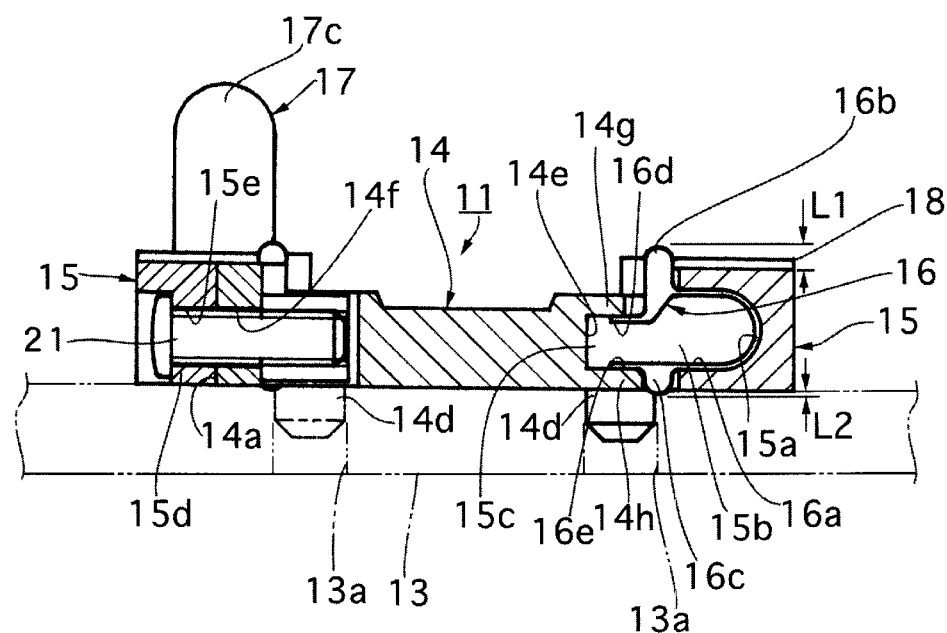
FIG. 4 is a sectional view taken along a line IV—IV of FIG. 1 according to the embodiment.

The notched portion 14a of the socket body 14 is formed with a fitting recess portion 14e into which the holder 15 is fitted (see FIG. 4).

Figure 6:
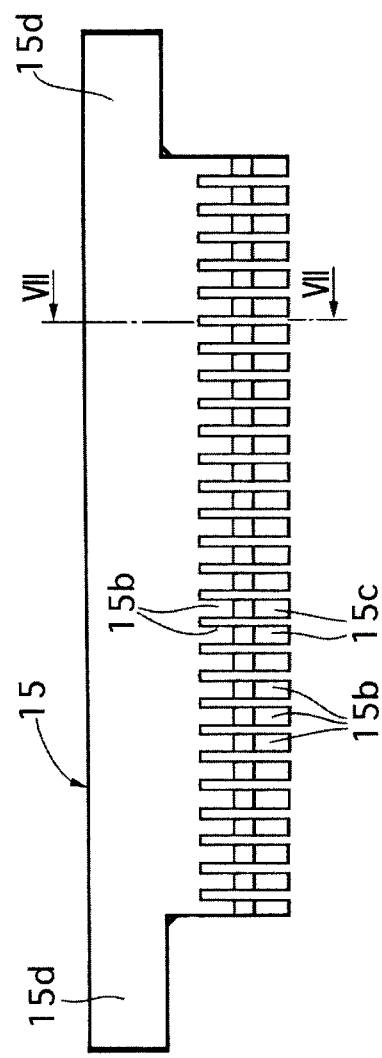
FIG. 6 is a top plan view of an holder related to the embodiment.
Figure 7:
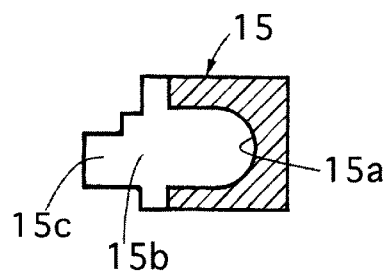
FIG. 7 is a sectional view taken along a line VII—VII of FIG. 6 according to the embodiment.
Figure 8:
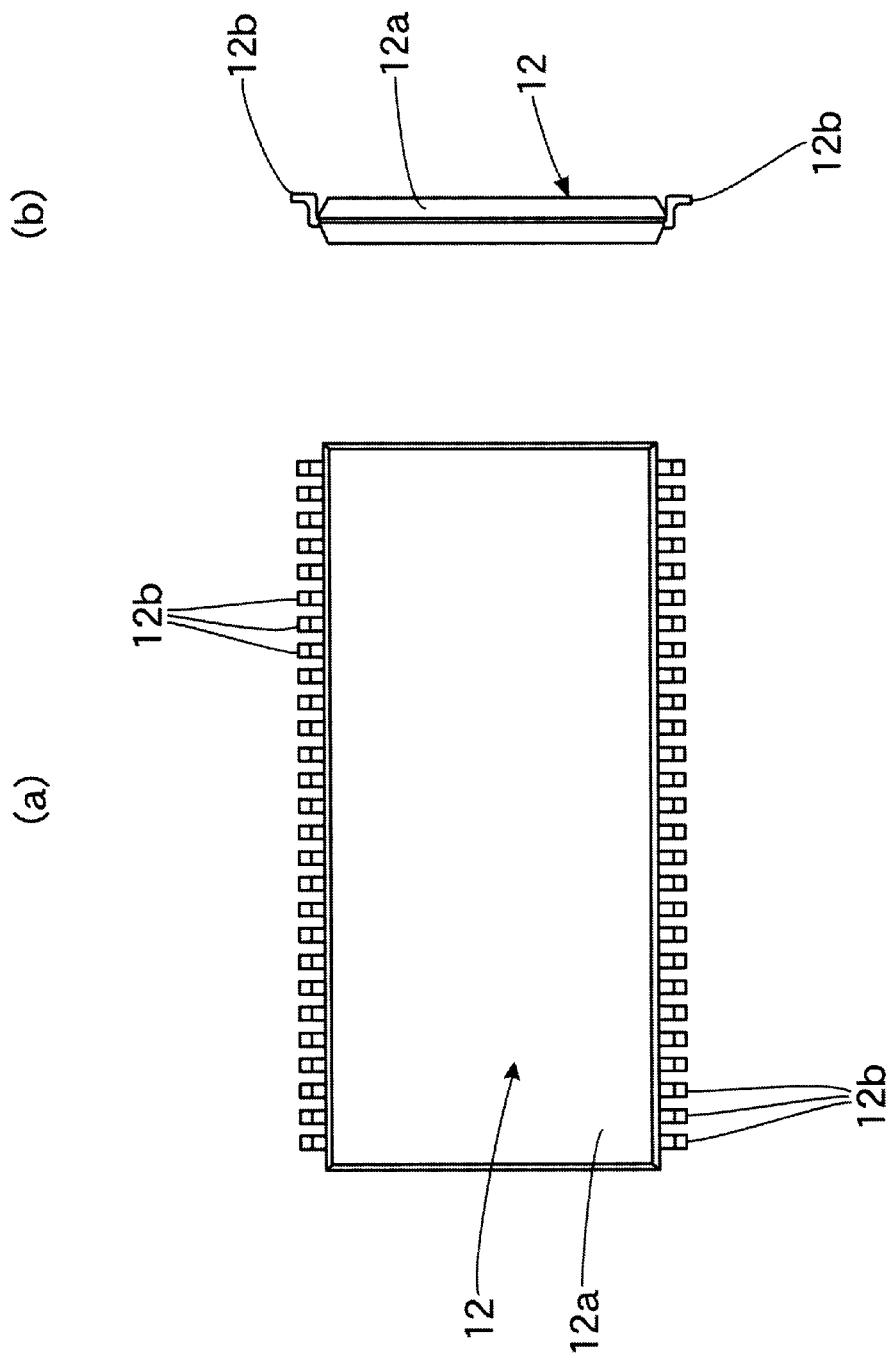
FIG. 8 is a view showing an IC package according to the embodiment, wherein (a) is a top plan view of the IC package, and (b) is a right-hand side elevational view.

On the other hand, the holder 15 as shown in FIGS. 6 and 7 is provided with containing portions 15a formed at predetermined pitches into which the contact pins 16 are fitted. The holder 15 is also provided with a large number of projecting insulating walls 15b which are adjacent to each other and interposed between the contact pins 16 which are being contained in the containing portions 15a, respectively. Front end portions 15c of the insulating walls 15b are arranged to be fitted into the fitting recesses 14e of the socket body 14.

Then, as shown in FIG. 4, a screw 21 is inserted into a through-hole 15e formed in an end portion 15d of the holder 15 so as to be threaded into a female threaded portion 14f formed in the socket body 14, thereby allowing the holder 15 to be removably mounted on the socket body 14 with the contact pins 16 held.

The contact pins 16 are formed by stamping out a thin plate material having an electrical conductivity and a resilience. Each of the contact pins 16 comprises a U-shaped contact pin body 16a, a contact portion 16b of the electrical part side formed close to the upper end portion of the U-shaped contact pin body 16a, and a contact portion 16c of the circuit substrate side formed close to the lower end portion of the U-shaped contact pin body 16a.

Both of the contact portions 16b and 16c are shaped to project outwardly of the U-shaped body. The contact portion 16b of the electrical part side is connected to the terminal 12b of the IC package 12 and the contact portion 16c of the circuit substrate side is connected to the circuit substrate 13.

Then, an amount of the projection L1 of the contact portion 16b of the electrical part side from the top surface, i.e., a "confronting surface" is set to be larger than the amount of the projection L2 of the contact portion 16c of the circuit substrate side from the bottom surface, i.e., a "confronting surface".

While the holder 15 is mounted on the socket body 14, the front end portions 16d and 16e of the U-shaped contact pin body 16a of the contact pin 16 are engaged with an upper wall 14g and an lower wall 14h of the fitting recess 14e as a "contact pin engagement portion" of the socket body 14, respectively, and are biased so that the two front end portions 16d and 16e get to be closer to each other, thereby applying a pre-load to the contact pin 16 (see FIG. 4).

Description will then be made of how to use the handler socket 11 having the described structure.

The plurality of handler sockets 11 are mounted on predetermined positions of the circuit substrate 13 in such a manner that the positioning projection portions 14d of the handler sockets 11 fit into the fitting holes 13a of the circuit substrate 13c. In such a mounted state, the contact portion 16c of the circuit substrate side of each contact pin 16 is pressed to be contacted with the circuit substrate 13.

Figure 9:
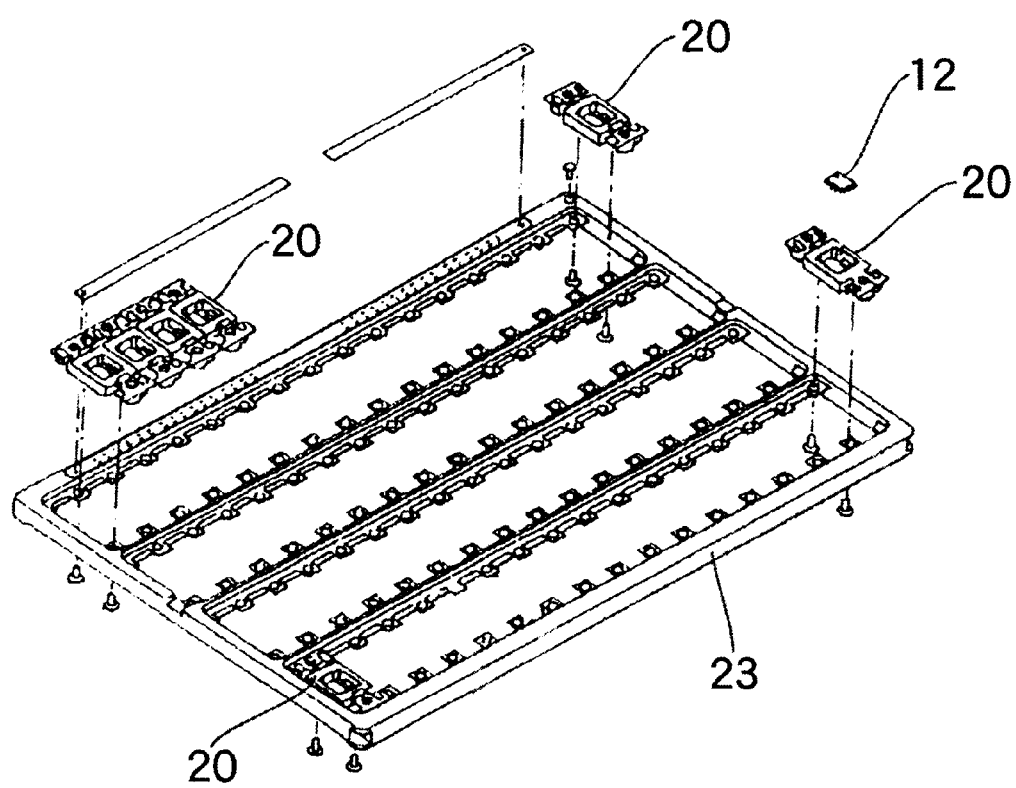
FIG. 9 is a perspective view of a test tray, IC carriers and so on according to the embodiment.

On the other hand, as shown in FIG. 9, a test tray 23 of the handler is mounted with a large number of IC carriers 20 and the IC packages 12 are contained in the IC carriers 20 so as to be positioned therein. In such a state that the IC carriers are mounted on the test tray 23, the test tray 23 is conveyed by a device not shown. Then, the IC carriers 20 are placed on the plurality of handler sockets 11 arranged on the predetermined positions of the circuit substrate 13 associated with the IC tester.

Afterward, the test tray 23 is moved downward so that the positioning pins 17 are fitted into the positioning holes formed in the IC carriers 2, respectively, whereby the IC carries 20 are contacted with the stopper pins 18, respectively.

In such a state of contacting the IC carries 20 with the stopper pins 18, the IC carriers 20 and thus the IC packages, the handler sockets 11 and the circuit substrate 13 are assembled together with predetermined positional relationships.

Then, the terminals 12b of the IC package 12 are pressed downward by a pressure-contact element of the handler side, which is not shown, so that the terminals 12b of the IC package 12 are pressed to be contacted with the contact portions 16b of the electrical part sides of the contact pins 16, respectively.

While the terminals 12b are pressed to be contacted with the contact portions 16b, the contact pins 16 are resiliently deformed so that terminals 12b of the IC packages 12 are contacted, by a predetermined pressure contact force, with the contact portions 16b of the electrical part sides of the contact pins 16, respectively.

The IC packages 12 are thus electrically connected to the circuit substrate 13 through the handler sockets 11 so that the IC packages 12 are tested by the IC tester, respectively. On the basis of the tested results, the IC packages 12 are sorted into non-defective and defective ones.

As described above, the structure of the contact pin 16 which is shaped into the U-shape and resiliently deformed makes it possible to reduce the thickness of the handler sockets 11 and to allow the two contact portions 16b and 16c of the contact pin 16 to be subjected to the same contact pressure, thereby improving a contact stability.

In addition, since each of the U-shaped contact pins 16 makes a flow path of a current short, the handler socket is suitable for the testing of the IC packages 12 by using a high frequency.

Moreover, the contact pins 16 are fitted into the fitting recess portions 14e of the socket body 14 by flexing the contact pins 16 to a small extent so as to be subjected to the pre-load, it is possible to improve an alignment of the contact pins 16 and to provide a uniform height of each of the contact portions 16b or 16c.

Furthermore, by setting the amount of projection L1 of the contact portion 16b of the electrical part side of the contact pin 16 to be larger than the amount of projection L2 of the contact portion 16c of the circuit substrate side thereof, it is possible to secure a stability of contact of the contact portion 16b of the electrical part with the terminal 12b of the IC package 12. That is, the total amount of resilient deformation of the U-shaped contact pin body 16a is determined by the contact pin 16, so that the respective amounts of displacement of the contact portions 16b and 16c result in the allocated amounts of the total amounts of resilient deformation. Thus, by setting the amount of projection L1 of the contact portion 16b of the electrical part side to be larger than the amount of projection L2 of the contact portion 16c of the circuit substrate side, it is possible to make the amount of displacement of the contact portion 16b large. As a result, it is able to ensure a longer distance of pressing the IC package 12 side, thereby suitably contacting the contact portion 16b of the electrical part side of the contact pin 16 with the terminal 12b of the IC package 12. On the contrary, although the amount of displacement of the contact portion 16c of the circuit substrate side is smaller than that of the contact portion 16b thereof, since the circuit substrate can not flex to a large extent, it is possible to sufficiently ensure the stability of contact irrespective of a smaller amount of displacement.

On the other hand, in such a handler socket 11, the socket body 14 or the holder 15 holding the contact pins 16 are replaced with another socket body or another holder, respectively, thereby allowing the sharing or the common use of the socket body 14 or the holder 15.

That is, even though the IC packages 12 have the same number of terminals 12b at the same pitches, in a case where the IC packages 12 have different IC carriers 20 or different circuit substrates 13, it is impossible to mount in the predetermined positional relationship the socket body 14 on the IC carrier 20 or on the circuit substrate 13.

That is, because the IC packages 12 have different IC carriers 20 or different circuit substrates 13, the positioning portions such as the positioning projection portions 14d of the socket bodies 14 are different in order to correspond the different IC carriers 20 or the different circuit substrates 13.

In such a case, the socket body 14 is only replaced with an alternative socket body, the positioning portions of which correspond to the IC carrier 20 or the like to be mounted on the alternative socket body, without replacing the holder 15 so that the holder 15 is mounted on the alternative socket body 14. Thus, since the socket body 14 is only replaced, but the holder 15 need not be replaced, it is possible to commonly use (share) the holder 15 with respect to the different IC carriers 20.

On the contrary, in spite of the same of the IC carriers 20, the circuit substrates 13 or the like, there are some cases where the IC packages 12 have different number of terminals 12b with same or different intervals.

Such a case could be dealt with replacement of only alternative holder 15 holding the contact pins 16 which correspond to the number of terminals 12b and the intervals therebetween of the IC package 12 to be mounted on the socket body 14 without replacing the socket body 14. In this manner, there is no need for the replacement of the socket body 14, with the need for the replacement of the holder 15 alone, thereby commonly using (sharing) the socket body 14 with respect to the different IC packages 12.

When mounting the holder 15 onto the socket body 14, it is possible to position the holder 15 by fitting the front end portion 15c of the insulating wall 15b of the holder 15 into the fitting recess 14e of the socket body 14, thereby imparting the positioning function to the insulating wall 15b for insulating the contact pins 16, making it possible to consequently improve the mounting workability and the positioning accuracy.

In order to secure the contact pins 16 to the holder 15, each U-shaped contact pin body 16a has merely to be fitted into each receiving portion 15a adapted to the shape of each contact pin body 15a.

Although the above embodiment has been applied to the IC packages 12 as "electrical part", it may otherwise be applied to any other types of IC packages or to other electrical parts than the IC packages.

INDUSTRIAL APPLICABILITY

As described above, the handler socket according to the present invention is suitably applicable of electrically connecting the IC package with the circuit substrate.

What is claimed is:

1. A handler socket having confronting surfaces adapted to be connected to an electrical part and a circuit substrate for an electrical conduction between the electrical part and the circuit substrate, said handler socket comprising:

a socket body, including a top surface, a bottom surface, and side surfaces, said top surface adapted to receive the electrical part, and said bottom surface adapted to receive the circuit substrate;

a plurality of contact pins contacting the electrical part and the circuit substrate so as to electrically connect the electrical part with the circuit substrate; and a holder configured to hold the plurality of contact pins, said holder adapted to be engaged with and disengaged from the socket body;

each of said contact pins having contact portions and being held to the holder so that the contact portions project from the confronting surfaces, and said holder being removably mounted on a first side surface of said side surfaces of the socket body.

2. A handler socket according to claim 1, wherein one of said socket body and said holder holding the contact pins is replaced with another one of said socket body and said holder, respectively, to allow sharing of the socket body and the holder in order to align different IC carriers or circuit substrates.

3. A handler socket according to claim 1, wherein said socket body is formed with positioning portions by which the electrical part or the circuit substrate is positioned, said socket body including the positioning portions which have different locations and different shapes is enabled to be mounted on the holder.

4. A handler socket according to claim 1, wherein each of said contact pins has a substantially U-shape, said contact portion being formed close to an end portion of each of the U-shaped contact pins.

5. A handler socket according to claim 1, wherein each contact portion of each of the contact pins has a projection shape which projects outwardly of the U-shaped portion, and wherein an amount of said projection of the contact portion of an electrical part side, to which the electrical part is connected, from the confronting surfaces is set to be larger than an amount of said projection of the contact portion of a circuit substrate side, to which the circuit substrate is connected, therefrom.

6. A handler socket according to claim 1, while the holder is mounted on the socket body, wherein an end portion of each of said contact pins is engaged with a contact pin engagement portion of the socket body so that each of the contact pins is subjected to a pre-load.

7. A handler socket according to claim 1, wherein said holder is provided with insulating walls interposed between the contact pins and adapted to insulate the contact pins, each of said insulating walls being adapted to be fitted into a fitting recess portion, said fitting recess portion being formed in the socket body.

8. A handler socket according to claim 1, wherein another holder holding a plurality of contact pins is adapted to be mounted on the side opposite to said first side surface of the socket body.

\* \* \* \* \*